United States Patent [19]

Sampei

[11] 4,163,197

[45] Jul. 31, 1979

[54] AUDIO-FREQUENCY POWER AMPLIFIER

[75] Inventor: Tohru Sampei, Yokohama, Japan

[73] Assignee: Hitachi, Ltd., Japan

[21] Appl. No.: 878,401

[22] Filed: Feb. 16, 1978

[30] Foreign Application Priority Data

Feb. 16, 1977 [JP] Japan .................................. 52-15003

[51] Int. Cl.² .............................................. H03F 3/18
[52] U.S. Cl. ...................................... 330/263; 330/66;
330/149; 330/260
[58] Field of Search ............... 330/255, 263, 276, 302,
330/149, 260, 66

[56] References Cited

U.S. PATENT DOCUMENTS

| | | | |
|---|---|---|---|
| 2,250,613 | 7/1941 | Wiegerinck et al. ................. | 330/149 |
| 2,989,705 | 6/1961 | Romano et al. ..................... | 330/66 X |
| 3,843,935 | 10/1974 | Seki ....................................... | 330/261 |
| 3,958,185 | 5/1976 | Hartung ................................ | 330/149 |

*Primary Examiner*—Lawrence J. Dahl
*Attorney, Agent, or Firm*—Craig and Antonelli

[57] ABSTRACT

In a push-pull power amplifier which amplifies an audio-frequency signal supplied thereto and supplies its output signal to a load, a pair of output transistors constituting the push-pull circuit are alternately turned on and off according to the polarity of the input signal. In the power amplifier, current flowing through the current path leading from a DC power source to each of the output transistors includes many harmonic components besides its fundamental wave component. These harmonic components of current are introduced through a stray magnetic field into the signal path in the power amplifier thereby producing distortion of the signal supplied to the load. To prevent this signal distortion, the signal path of the audio-frequency signal is magnetically coupled to the current paths from the DC power source, so that the harmonic components of current flowing through the current paths can be supplied to the signal path with the phase and the signal level which cancel the harmonic components of current introduced into the signal path through the stray magnetic field thereby minimizing distortion of the amplifier output signal.

14 Claims, 6 Drawing Figures

AUDIO-FREQUENCY POWER AMPLIFIER

This invention relates to an audio-frequency power amplifier for amplifying an audio-frequency signal supplied thereto, and more particularly to a push-pull power amplifier for supplying its output signal to a load.

An audio-frequency power amplifier for amplifying an audio-frequency signal supplied thereto and supplying its output signal to a load such as a loudspeaker comprises a signal path for the audio-frequency signal between an input terminal to which the audio-frequency signal is supplied and an output terminal with which the load is connected. This power amplifier further comprises active elements such as transistors for amplfying the audio-frequency signal, and current paths for supplying power to these active elements. These signal and current paths are generally formed as part of a printed circuit obtained by etching away unnecessary portions of copper foil applied to a laminated plate of synthetic resin material providing a printed circuit board. The signal path is arranged so that its input side may not cross its output side to prevent oscillation, and consideration is also taken so that the signal path may not be closely adjacent to the current paths. However, it is difficult, as a matter of fact, to arrange all these paths in spaced apart relation within the limited area of the printed circuit board, and the signal path and current paths are frequently disposed in closely adjacent relation. In such a case, the signal path and current paths are frequently magnetically coupled to each other by a stray magnetic field.

When the output stage of the power amplifier includes a class B push-pull amplifier, the active elements constituting the output stage are alternately turned on in the positive and negative half cycles respectively of the input signal, and the half-wave portions of current corresponding to the positive and negative half cycles of the input signal flow into these active elements respectively when the input signal has a sinusoidal waveform. The half wave of current includes harmonic components besides its fundamental wave component, and when the signal path is magnetically coupled to the current paths by a stray magnetic field, the harmonic components of current are introduced into the signal path through the magnetic coupling thereby producing distortion in the output signal supplied to the load.

When the output stage of the power amplifier includes semiconductor elements such as bipolar transistors or field effect transistors, the output transistors in the output stage are mounted on a heat sink fixed to a suitable portion such as a portion of the chassis. Jumper wires are used to connect the output electrodes of the output transistors mounted on the heat sink with the output terminal which is connected with the load. These jumper wires are frequently located in closely adjacent relation to the current paths, and introduction of harmonic components of current into the signal path occurs principally at the location of these jumper wires. The harmonic components of current appear more conspicuously at higher frequencies of the input signal. Therefore, undesirable distortion occurs in a music signal when the power amplifier is used to amplify the music signal of audio-frequency to be reproduced by a radio receiver or disk record.

It is therefore an object of the present invention to provide a novel and improved audio-frequency power amplifier which can amplify an audio-frequency signal without giving rise to any substantial distortion.

Another object of the present invention is to provide a push-pull power amplifier which employs transistors and can amplify an audio-frequency signal without giving rise to any substantial distortion.

The audio-frequency power amplifier according to the present invention comprises, in its output stage, a push-pull amplifier constituted by a pair of transistors of respectively opposite conductivity types. An audio-frequency signal supplied to its input terminal is amplified by a preamplifier to be supplied to the input electrodes of the transistors constituting the push-pull amplifier, and this audio-frequency signal is then subjected to power amplification by the push-pull amplifier to be supplied to a load from the output electrodes of the transistors constituting the push-pull amplifier. The preamplifier and push-pull amplifier are connected with a DC power source to receive power supplied from the power source, and the current paths of current flowing from the power source are magnetically coupled to the signal path of the audio-frequency signal to supply the harmonic components of current flowing through the current paths to the signal path through the magnetic coupling, so that the harmonic components of current introduced into the signal path from the current paths through a stray magnetic field can be cancelled by the harmonic components of current supplied to the signal path from the current paths through the magnetic coupling thereby minimizing distortion due to the harmonic components included in the output signal. For this purpose, the polarity and signal level of the harmonic components of current supplied to the signal path through the magnetic coupling are selected to cancel the harmonic components of current introduced into the signal path through the stray magnetic field, and this is attained by controlling the coupling coefficient of the magnetic coupling.

Other objects, features and advantages of the present invention will become apparent from the following detailed description of preferred embodiments thereof taken in conjunction with the accompanying drawings, in which.

Preferred embodiments of the audio-frequency power amplifier according to the present invention will now be described in detail with reference to the drawings.

Figure 1:
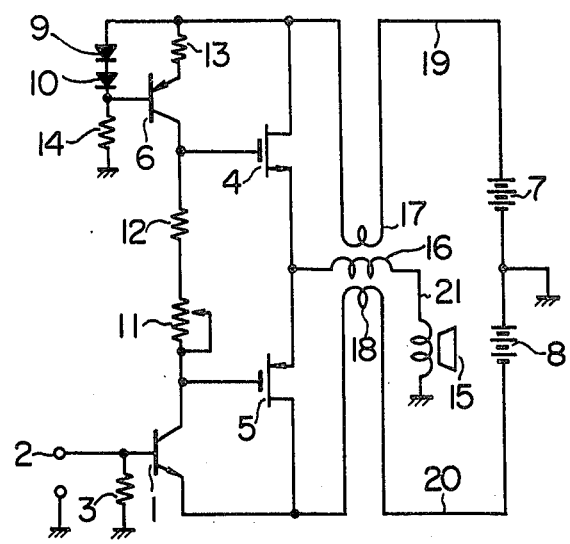
FIG. 1 is a circuit diagram of an embodiment of the audio-frequency power amplifier according to the present invention.

Referring first to FIG. 1 which is a circuit diagram of an embodiment of the audio-frequency power amplifier according to the present invention, a driver transistor 1 functioning as a preamplifier stage is connected at its base with an input terminal 2, and this base is grounded through a resistor 3. The collector of driver transistor 1 is connected with the gate of an output transistor 5 and also with the collector of a current regulating transistor 6 through a variable resistor 11 and a fixed resistor 12. The base of current regulating transistor 6 is connected with a pair of series-connected diodes 9 and 10 and grounded through a resistor 14. The emitter of transistor 6 is connected with the positive power supply terminal of a first DC power source 7 through a resistor 13, and the collector of transistor 6 is connected with the gate of another output transistor 4. The two diodes 9 and 10 are connected in series in the forward direction, and one of the diodes or diode 9 is connected with the positive power supply terminal of first DC power source 7, while the other diode 10 is connected with the base of transistor 6. The forward current supplied from these two diodes 9 and 10 applies a constant voltage to the base of transistor 6 so that a constant current appears at the collector of transistor 6 to determine the operating point of the two output transistors 4 and 5. The first output transistor 4 is an N-channel enhancement type insulated gate field effect transistor, and the second output transistor 5 is a P-channel enhancement type insulated gate field effect transistor. The source of transistor 4 is connected with the source of transistor 5, and a loudspeaker 15 is connected between the connection point of the common-connected sources of transistors 4, 5 and a point of reference potential or ground potential. The loudspeaker 15 provides the load of the output transistors 4 and 5, and a first coupling coil 16 is connected in series with the loudspeaker 15 between the loudspeaker 15 and the connection point of the common-connected sources of output transistors 4 and 5. The drain of transistor 4 is connected with the positive power supply terminal of first DC power source 7 through a second coupling coil 17, and the drain of transistor 5 is connected with the negative power supply terminal of a second DC power source 8 through a third coupling coil 18. The negative power supply terminal of first DC power source 7 is connected with the positive power supply terminal of second DC power source 8, and their connection point is grounded. Power is supplied from the first and second DC power sources 7 and 8 to the driver transistor 1, current regulating transistor 6 and two output transistors 4 and 5.

In such an audio-frequency power amplifier, an audio-frequency signal is supplied through the input terminal 2 to the base of driver transistor 1, and the audio-frequency signal amplified by the transistor 1 is supplied from the collector of transistor 1 to the gates of output transistors 4 and 5. The first output transistor 4 is turned on in response to the application of the signal voltage of the positive half cycle of the audio-frequency signal supplied from the driver transistor 1, while the second output transistor 5 is turned on in response to the application of the signal voltage of the negative half cycle of the audio-frequency signal, and the audio-frequency signal amplified by these output transistors 4 and 5 is supplied to the load 15. Thus, the audio-frequency signal supplied to the input terminal 2 is supplied to the load 15 through a first signal path portion leading from the input terminal 2 to the base of transistor 1, through a second signal path portion leading from the collector of transistor 1 to the gates of output transistors 4 and 5, and through a third signal path portion leading from the sources of output transistors 4 and 5 to the load 15, and while passing through the signal paths, the audio-frequency signal is amplified by the driver transistor 1 and output transistors 4 and 5. The output transistors 4 and 5 constitute a single-ended class B push-pull amplifier. Thus, these two output transistors 4 and 5 are repeatedly sequentially turned on and off in the successive positive and negative half cycles of the audio-frequency signal voltage supplied to their gates. Therefore, when the audio-frequency signal voltage supplied to their gates has a sinusoidal waveform, current corresponding to the positive half cycle of the audio-frequency signal voltage of sinusoidal waveform provides the drain current of output transistor 4, and current corresponding to the negative half cycle provides the drain current of output transistor 5. Such a drain current includes many harmonic components besides its fundamental wave component.

A magnetic field is produced around the current paths and signal path due to the flow of current therethrough. When the signal path and current paths are closely adjacent to each other, these paths are electromagnetically coupled by these stray magnetic fields, and the harmonic components of current flowing through the current paths are introduced into the signal path through this electromagnetic coupling.

In the present invention, the second coupling coil 17 is connected in the current path 19 connecting the drain of output transistor 4 with the positive power supply terminal of first DC power source 7, and this second coupling coil 17 is disposed in closely adjacent relation to the first coupling coil 16 connected in the signal path 21 connecting the sources of output transistors 4 and 5 with the load 15, so that the first and second coupling coils 16 and 17 are electromagnetically coupled to each other. The third coupling coil 18 is connected in the current path 20 connecting the drains of output transistors 4 and 5 with the negative power supply terminal of second DC power source 8, and this third coupling coil 18 is also disposed in closely adjacent relation to the first coupling coil 16 to be electromagnetically coupled to the first coupling coil 16. Large current including many harmonic components flows intermittently through the current paths 19 and 20 as the output transistors 4 and 5 are sequentially turned on and off, and these harmonic components are supplied to the first coupling coil 16 since it is electromagnetically coupled to the second and third coupling coils 17 and 18. Therefore, when harmonic components of phase opposite to that of the harmonic components introduced into the signal path 21 through the electromagnetic coupling of the stray magnetic field around the signal path 21 and the stray magnetic fields around the current paths 19 and 20 are supplied to the signal path 21 through the electromagnetically coupled coupling coils 16, 17 and 18, the latter harmonic components are cancelled by the former so that an output signal substantially free from distortion can be supplied to the load 15. For this purpose, the connection of the coupling coils 17 and 18 may be reversed or the direction thereof may be suitably changed to regulate the phase of the harmonic components induced in the coupling coil 16, or the coupling coefficients of the coupling coil 16 and the coupling coils 17 and 18 may be suitably changed to vary the signal level of the harmonic components induced in the coupling coil 16.

The individual coupling coils 16, 17 and 18 are provided by winding a copper wire by a plurality of turns. However, the number of turns of the coupling coils 16, 17 and 18 need not be so large since the highest frequency of the harmonic components of current flowing through the current paths 19 and 20 is about 20 KHz. The coils obtained by winding a copper wire may be replaced by simple coils provided by merely twisting a portion of the conductors of the signal path 21 and current paths 19, 20 into a loop form. Further, the current paths 19 and 20 may be partly closely juxtaposed with the signal path 21, so that these paths 19, 20 and 21 may extend in parallel relation over a predetermined distance to provide the desired electromagnetic coupling therebetween.

Figure 2:
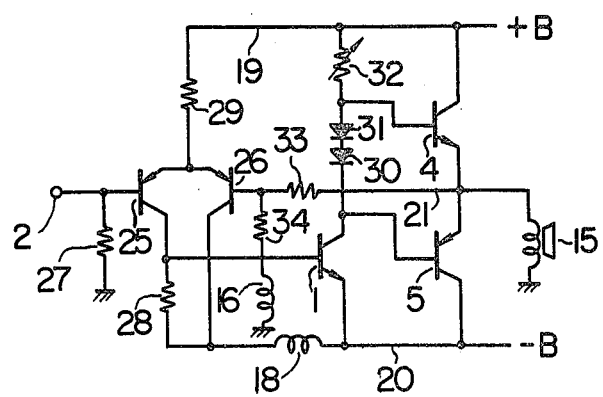
FIG. 2 is a circuit diagram of another embodiment of the audio-frequency power amplifier according to the present invention.

FIG. 2 shows another embodiment of the audio-frequency power amplifier according to the present invention. Referring to FIG. 2, the power amplifying stage comprises an NPN-type output transistor 4 and a PNP-type output transistor 5 which constitute a single-ended class B push-pull circuit. The power amplifier shown in FIG. 2 includes a small signal amplifying transistor 25 which amplifies an audio-frequency signal of low signal level supplied to an input terminal 2. This transistor 25 constitutes a differential amplifier together with a negative feedback signal amplifying transistor 26. These transistors 25 and 26 are common-connected at their emitters, and the connection point of the common-connected emitters is connected with a positive power supply terminal +B through a resistor 29. The base of transistor 25 is grounded through a resistor 27, and the collector thereof is connected with a negative power supply terminal −B through a resistor 28. A driver transistor 1 is connected at its base with the collector of transistor 25 and at its collector with the positive power supply terminal +B through a pair of series-connected diodes 30, 31 and a variable resistor 32. The emitters of output transistors 4 and 5 are connected with a load 15 and also with the base of transistor 26 through a negative feedback resistor 33 in a negative feedback path 21. The base of transistor 26 is grounded through a resistor 34 and a coupling coil 16, and the collector thereof is connected directly with the negative power supply terminal −B. The coupling coil 16 is connected in series with the resistor 34, and the resistors 33 and 34 act to regulate the amount of negative feedback to the transistor 26. A second coupling coil 18 is disposed in closely adjacent relation to the first coupling coil 16 and is connected in a current path 20 extending from the negative power supply terminal −B. This coupling coil 16 is electro-magnetically coupled to another coupling coil 18.

In the audio-frequency power amplifier shown in FIG. 2, harmonic components of current flowing through the current path 20 are supplied through the electromagnetically coupled coupling coils 16 and 18 to the negative feedback path 21 which is the signal path. The harmonic components supplied to the negative feedback path 21 are supplied to the transistor 26 together with the negative feedback signal fed back from the emitters of output transistors 4 and 5. Then, the harmonic components are supplied to the output transistors 4 and 5 through the transistor 25 which constitutes the differential amplifier together with the transistor 26 so as to cancel the harmonic components introduced into the signal path 21 to the load 15 by the action of the stray magnetic fields.

In the power amplifier configurations shown in FIGS. 1 and 2, currents substantially equivalent to the drain current and collector current of the output transistors 4 and 5 flow through the source circuit and emitter circuit of each of the output transistors 4 and 5, and the source circuit and emitter circuit provide a signal path and also a current path. Since the harmonic components included in the current flowing through these current paths are induced due to the sequential on-off of the output transistors 4 and 5 in response to the application of the input signal, the current flowing through the source circuit and emitter circuit of each of the output transistors 4 and 5 includes also such harmonic components.

Figure 3:
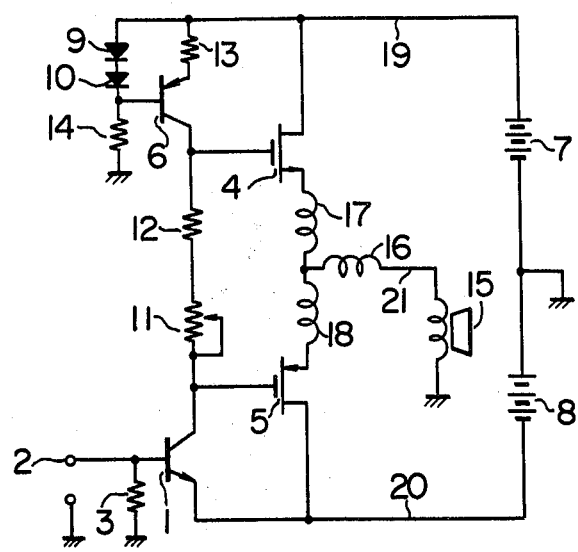
FIG. 3 is a circuit diagram of still another embodiment of the audio-frequency power amplifier according to the present invention.

FIG. 3 shows still another embodiment, or a modification of the first embodiment, of the present invention in which a coupling coil is inserted in the source circuit of each of the output transistors to cancel the harmonic components included in the current flowing through the source circuit. Referring to FIG. 3, one end of the second coupling coil 17 is connected with the source of first output transistor 4, and one end of the third coupling coil 18 is connected with the source of second output transistor 5. The other end of the second coupling coil 17 is connected with the other end of the third coupling coil 18, and the first coupling coil 16 is connected between the load 15 and the common-connection point of the second and third coupling coils 17 and 18. The first coupling coil 16 is disposed in closely adjacent relation to the second and third coupling coils 17 and 18 to be magnetically coupled to the latter. Source currents of the output transistors 4 and 5 flow through the second and third coupling coils 17 and 18 respectively, and harmonic components included therein are induced in the first coupling coil 16. Due to the magnetic coupling between the stray magnetic fields around the current paths 19, 20 and the stray magnetic field around the signal path 21, the harmonic components of currents introduced from the current paths 19 and 20 into the signal path 21 are cancelled by the harmonic components induced in the first coupling coil 16.

Figure 4:
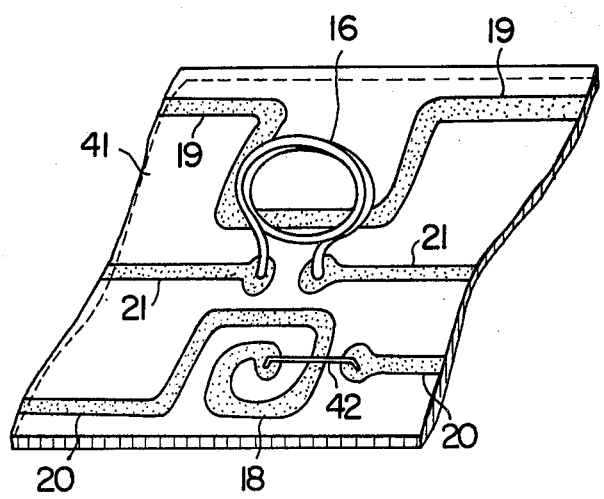
FIG. 4 is a schematic perspective view of part of one form of a printed circuit board used for the audio-frequency power amplifier according to the present invention.

FIG. 4 shows part of a printed circuit board 41 on which the individual parts of the audio-frequency power amplifier are fixed and connected with each other. The printed circuit board 41 is provided by applying foil of copper on a thin laminated plate of synthetic resin material such as phenol resin, printing the desired circuit pattern on the copper foil and removing unnecessary portions of the copper foil to leave the designed circuit arrangement. The coupling coils shown in FIGS. 1 to 3 can also be provided as part of the printed circuit. In FIG. 4, the two current paths 19 and 20 and the signal path 21 disposed between these current paths 19 and 20 are shown printed on the printed circuit board 41. The signal path 21 is divided into two path portions as shown, and the first coupling coil 16 is connected between the divided portions of the signal path 21. The current path 20 is also divided into two path portions, and one of the path portions is formed into a spiral shape as shown to provide the third coupling coil 18. The center of the spiral providing the third coupling coil 18 is connected with the other portion of the current path 20 by a jumper wire 42. The current path 19 has a portion thereof bent toward the first coupling coil 16 as shown so that such a portion lies closely adjacent to the first coupling coil 16. This coupling coil 16 is is an air-core coil obtained by winding a copper wire by a plurality of turns. This coil 16 has a short axial length compared with its diameter, so that the axial direction of the coil 16 can be freely changed. The first and third coupling coils 16 and 18 are disposed closely adjacent to each other so that the coupling coefficient of the coupling coil 16 and the current path 19 and that of the coupling coils 16 and 18 can be suitably adjusted by inclining the first coupling coil 16 toward the current path 19 or third coupling coil 18. Further, the phase of harmonic components induced in the first coupling coil 16 can be suitably adjusted by varying the axial direction of this coil 16.

Figure 5:
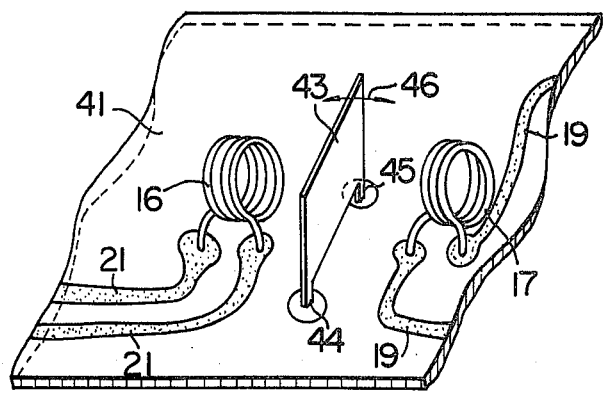
FIG. 5 is a schematic perspective view of part of another form of the printed circuit board used for the audio-frequency power amplifier according to the present invention.

FIG. 5 shows another form of the printed circuit board 41. Referring to FIG. 5, the first coupling coil 16 is connected in the signal path 21, and the second coupling coil 17 is connected in the current path 19. A shielding plate 43 of magnetic material is disposed in the space between the first and second coupling coils 16 and 17, and a pair of spaced projections 44 and 45 provided on the lower part of this shielding plate 43 are soldered to the printed circuit board 41. The coupling coefficient of the coupling coils 16 and 17 can be suitably adjusted by inclining the shielding plate 43 in either direction shown by the arrows 46.

Figure 6:
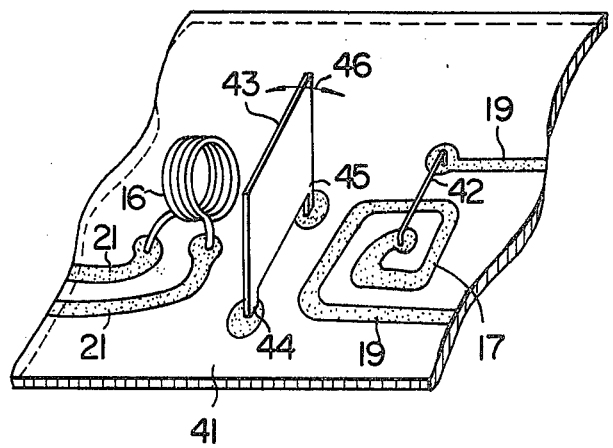
FIG. 6 is a schematic perspective view of part of still another form of the printed circuit board used for the audio-frequency power amplifier according to the present invention.

FIG. 6 shows still another form of the printed circuit board 41. Referring to FIG. 6, the signal path 21 is printed on the printed circuit board 41, and the first coupling coil 16 is connected between the divided portions of this signal path 21. The current path 19 is also printed on the printed circuit board 41, and the second coupling coil 17 is formed as part of one of the divided portions of the current path 19 and connected to the other portion by a jumper wire 42. These two coupling coils 16 and 17 are disposed in closely adjacent relation to be magnetically coupled to each other. A shielding plate 43 similar to that shown in FIG. 5 is disposed in the space between these coils 16 and 17 so that the coupling coefficient of the magnetic coupling between these coils 16 and 17 can be suitably adjusted by inclining the shielding plate 43 in either direction shown by the arrows. The polarity of harmonic components induced in the coupling coil 16 can be suitably adjusted by varying the axial direction of the coil 16, and the signal level can be suitably controlled by the inclination of the shielding plate 43.

In the prior art power amplifier of this kind, harmonic components of current flowing through the current path are introduced into the signal path due to the fact that the signal path is magnetically coupled to the current path by the stray magnetic field, and such harmonic components provide a source of distortion of the signal supplied to the load. According to the present invention, the signal path is positively magnetically coupled to the current path by the coupling coils so that such unnecessary harmonic components can be cancelled to minimize undesirable distortion of the signal supplied to the load.

What is claimed is:

1. An audio-frequency power amplifier comprising:
   a preamplifier stage having an input terminal and an output terminal;
   a push-pull amplifier stage having an input terminal and an output terminal;
   input means supplying an audio-frequency signal to said input terminal of said preamplifier stage;
   means connected between said output terminal of said preamplifier stage and said input terminal of said power amplifier stage for supplying the output signal of said preamplifier stage to said power amplifier stage;
   a load circuit connected with said output terminal of said power amplifier stage to receive the output signal of said power amplifier stage whereby a signal path for the audio-frequency signal is established between the input means supplying the audio-frequency signal and the load circuit through the push-pull power amplifier;
   DC power source means for supplying power via a current path to said preamplifier stage and said power amplifier stage; and
   magnetic coupling means comprising a first coupling coil connected in series with the signal path of said audio-frequency signal and a second coupling coil connected in series with the current path of current supplied from said DC power source means for supplying the harmonic components of current flowing through said current path to said signal path with the phase and the signal level which cancel the harmonic components of current included in said output signal supplied to said load circuit.

2. An audio-frequency power amplifier comprising:
   a preamplifier stage having an input terminal and an output terminal;
   a push-pull power amplifier stage having an input terminal and an output terminal;
   input means connected with said input terminal of said preamplifier stage to supply an audio-frequency signal thereto;
   means connected between said output terminal of said preamplifier stage and said input terminal of said power amplifier stage for supplying the output signal of said preamplifier stage to said power amplifier stage;
   a load circuit connected with said output terminal of said power amplifier stage to receive the output signal of said power amplifier stage;
   a negative feedback circuit negatively feeding back said output signal of said power amplifier stage to said preamplifier stage;
   a DC power source supplying power to said preamplifier stage and said power amplifier stage; and
   magnetic coupling means for providing a magnetic coupling between said negative feedback circuit and the current path of current supplied from said DC power source, said magnetic coupling supplying the harmonic components of current flowing through said current path to said negative feedback circuit with the phase and the signal level which cancel the harmonic components of current included in said output signal supplied to said load circuit.

3. An audio-frequency power amplifier as claimed in claim 2, wherein said magnetic coupling means includes a coupling coil connected in said negative feedback circuit and another coupling coil connected in said current path.

4. An audio-frequency power amplifier as claimed in claim 3, wherein a shielding means is disposed between said one coupling coil and said another coupling coil.

5. An audio-frequency power amplifier comprising:
   a first output transistor including an input electrode, an output electrode and a common electrode;
   a second output transistor including an input electrode, an output electrode and a common electrode, said second output transistor being of the conductivity type opposite to that of said first output transistor;

input circuit means connected with said input electrodes of said first and second output transistors for supplying an input signal of audio-frequency to said first and second output transistors;

an output terminal;

means for connecting said output electrode of said first output transistor with said output terminal;

means for connecting said output electrode of said second output transistor with said output terminal;

a load circuit connected with said output terminal to receive the respective output signals of said first and second output transistors;

a first DC power source supplying power to said common electrode of said first output transistor;

a second DC power source supplying power to said common electrode of said second output transistor, said second DC power source being of the polarity opposite to that of said first DC power source;

a first coupling coil connected between said output terminal and said load circuit;

a second coupling coil connected in series with the current path of current supplied from said first DC power source, said second coupling coil being magnetically coupled to said first coupling coil; and a third coupling coil connected in series with the current path of current supplied from said second DC power source, said third coupling coil being magnetically coupled to said first coupling coil, said second and third coupling coils supplying the harmonic components of respective currents flowing therethrough to said first coupling coil with the phase and the signal level which cancel the harmonic components of respective currents included in said output signals supplied to said load circuit.

6. An audio-frequency power amplifier as claimed in claim 5, wherein at least one of said first, second and third coupling coils is provided as part of a printed circuit.

7. An audio-frequency power amplifier as claimed in claim 5, wherein shielding means is disposed in at least one of the space between said first coupling coil and said second coupling coil and the space between said first coupling coil and said third coupling coil.

8. An audio-frequency power amplifier comprising:

a pair of output transistors each including an input electrode, an output electrode and a common electrode, said output transistors being of respectively opposite conductivity types;

input circuit means for supplying an audio-frequency signal to said input electrodes of said output transistor pair;

an output terminal;

a load circuit connected between said output terminal and a point of reference potential;

a first coupling coil connected between said output terminal and said load circuit;

a second coupling coil connected between said output terminal and said output electrode of one of said output transistors constituting said transistor pair, said second coupling coil being magnetically coupled to said first coupling coil;

a third coupling coil connected between said output terminal and said output electrode of the other of said output transistors constituting said transistor pair, said third coupling coil being magnetically coupled to said first coupling coil;

a first DC power source connected between said common electrode of said first-mentioned output transistor and said point of reference potential; and a second DC power source connected between said common electrode of said second-mentioned output transistor and said point of reference potential, said second and third coupling coils supplying the harmonic components of respective currents flowing therethrough to said first coupling coil with the phase and the signal level which cancel the harmonic components of respective currents included in the signal supplied to said load circuit.

9. An audio-frequency power amplifier comprising:

a single-ended push-pull power amplifier stage having an input terminal and an output terminal;

input means supplying an audio-frequency signal to said input terminal of said power amplifier stage;

a load circuit connected with said output terminal of said power amplifier stage to receive the output signal of said power amplifier stage whereby a signal path for said audio-frequency signal is established between the input means supplying the audio-frequency signal and the load circuit through said power amplifier;

a DC power source supplying power to said power amplifier stage through a current path; and magnetic coupling means comprising a first coupling coil connected in series with the signal path of said audio-frequency signal and a second coupling coil connected in series with the current path of current supplied from said DC power source for supplying the harmonic components of current flowing through said current path to said signal path with the phase and the signal level which cancel the harmonic components of current included in the output signal supplied to said load circuit.

10. An audio-frequency power amplifier as claimed in claim 9, wherein at least one of said coupling coils is provided as part of a printed circuit.

11. An audio-frequency power amplifier as claimed in claim 9, wherein shielding means is disposed between said coupling coils.

12. An audio-frequency power amplifier as claimed in claim 10, wherein shielding means is disposed between said coupling coils.

13. An audio-frequency power amplifier as claimed in claim 11, wherein said shielding means is adapted to be inclined toward and away from one of said coupling coils thereby controlling the coupling coefficient of the magnetic coupling provided by said coupling coils.

14. An audio-frequency power amplifier as claimed in claim 12, wherein said shielding means is adapted to be inclined toward and away from one of said coupling coils thereby controlling the coupling coefficient of the magnetic coupling provided by said coupling coils.

* * * * *